United States Patent [19]

Verfaillie et al.

[11] Patent Number: 4,542,347

[45] Date of Patent: Sep. 17, 1985

[54] DEMODULATOR CIRCUIT WITH INTEGRATED AUTOMATIC GAIN CONTROL

[75] Inventors: Guido A. M. Verfaillie, Gent; Dirk Breynaert, Temse, both of Belgium

[73] Assignee: International Standard Electric Corporation, New York, N.Y.

[21] Appl. No.: 477,575

[22] Filed: Mar. 21, 1983

[30] Foreign Application Priority Data

Mar. 30, 1982 [BE] Belgium ............................. 59652

[51] Int. Cl.[4] ............................................. H03D 3/00
[52] U.S. Cl. ....................................... 329/124; 329/50
[58] Field of Search ................. 329/50, 110, 122, 124, 329/132, 134

[56] References Cited

U.S. PATENT DOCUMENTS

| | | | |
|---|---|---|---|
| 4,123,718 | 10/1978 | Lampert et al. | 329/50 X |
| 4,270,221 | 5/1981 | Daniel | 329/124 X |
| 4,377,728 | 3/1983 | Hilbert | 329/124 X |

*Primary Examiner*—Eugene R. LaRoche
*Assistant Examiner*—Robert J. Pascal
*Attorney, Agent, or Firm*—John T. O'Halloran; Thomas P. O'Hare

[57] ABSTRACT

A demodulator circuit for demodulating a suppressed carrier phase modulated data input signal includes a carrier recovery circuit providing orthogonal reference carrier signals, first and second demodulation circuits for demodulating the signal with the orthogonal reference carrier signals, at least one data estimation circuit for deriving a first data estimation circuit from the demodulated signal, a second demodulated signal being delayed to obtain a signal which in combination with the first data estimation signal controls the carrier recovery circuit. The circuit further includes an automatic gain control which in response to the first data estimation and to a delayed first demodulated signal provides an AGC output signal. The AGC circuit is substantially unaffected by the noise in the input signal because of the matched filters circuit which is matched to the first demodulated signal and which in response thereto provides a filtered output signal having an optimum signal noise ratio at a predetermined instant of each data signal of the first demodulated signal, and a data sampling circuit for sampling the circuit output signal at predetermined instants to provide the first data estimation signal. A sweep generator circuit is operable to control a reference carrier signal in the modulation signal when the quality of a filtered output signal is not above a predetermined level.

14 Claims, 5 Drawing Figures

4,542,347

DEMODULATOR CIRCUIT WITH INTEGRATED AUTOMATIC GAIN CONTROL

BACKGROUND OF THE INVENTION

The present invention relates to a demodulator circuit for demodulating a suppressed carrier phase modulated data input signal, including a carrier recovery circuit providing orthogonal reference carrier signals, first and second demodulation circuits for demodulating said input signal with respective ones of said orthogonal reference carrier signals to provide first and second demodulated signals respectively, at least one data estimation circuit for deriving a first data estimation signal from said first demodulated signal, said second demodulated signal being delayed to obtain a delayed second demodulated signal which in combination with said first data estimation signal controls said carrier recovery circuit.

Such a demodulator circuit is already known from the book "Telecommunication Systems Engineering" by W. C. Lindsey and M. R. Simon, Prentice Hall, Inc. and more particularly from FIGS. 2-26 on page 64 thereof.

SUMMARY OF THE INVENTION

An object of the present invention is to provide a demodulator circuit of the above type but wherein an automatic gain control is performed using a minimum of additional equipment.

According to the invention this object is achieved due to the fact that it further includes an AGC circuit which in response to said first data estimation signal and to a delayed first demodulated signal derived from said first demodulated signal provides an AGC output signal.

The present AGC circuit thus makes use in an advantageous way of various signals already available in the demodulator circuit, so that no additional equipment is required to generate such signals.

Another object of the present invention is to provide an AGC circuit the operation of which is substantially unaffected by the presence of noise in the input signal.

According to the invention this object is achieved due to the fact that said data estimation circuit includes a matched filter circuit which is matched to said first demodulated signal and which in response thereto provides a filtered output signal having an optimum signal-to-noise ratio at a predetermined instant of each data signal of said first demodulated signal, and a data sampling circuit for sampling said filtered output signal at said predetermined instants to provide said first data estimation signal and that said AGC circuit includes at least one multiplier circuit for multiplying said delayed first demodulated signal and said first data estimation signal, a second filter circuit for filtering the output signal of said first multiplier circuit and providing said AGC output signal, and input signal magnitude regulating means to which said input signal and said AGC output signal are supplied.

As is well known in the art, the data estimation signal provided by a data estimation circuit contains a number of data signal errors because due to the presence of noise in the signal supplied to the data estimation circuit, faulty decisions have been taken therein. In order that a demodulator circuit should be acceptable in practice, the signal error rate should be relatively small in the presence of maximum noise. By using a matched filter circuit and sampling the output signal thereof at instants where the signal-to-noise ratio of the data signals of the demodulated signal is optimum, the signal error rate of the resulting data estimation signal is always a minimum in the presence of noise in the demodulated signal and by multiplying the latter signal and the data estimation signal, an AGC output signal is obtained which, as found, is substantially unaffected by the noise of the demodulated signal and the signal errors of the data estimation signal.

The present invention also relates to a demodulator circuit for demodulating a suppressed carrier phase modulated data input signal, with at least one phaselock loop circuit which includes a demodulation circuit for demodulating said input signal with a reference carrier signal provided by a controlled oscillator, a sweep generator circuit controlling said controlled oscillator, and a first filter circuit filtering a demodulated output signal supplied by said demodulation circuit and providing a filtered output signal.

Such a demodulator circuit is also already known from U.S. Pat. No. 4,092,606.

Another object of the present invention is to provide a demodulator circuit of the last described type but with an improved sweep generator circuit.

According to the invention the object is achieved due to the fact that it further includes ascertaining means for ascertaining the quality of said filtered output signal and producing a sweep generator control signal which is indicative of a predetermined quality and controls said sweep generator circuit.

Another characteristic feature of the present demodulator circuit is that it further includes a clocking circuit for deriving a clock signal from said filtered output signal of said first filter circuit and that said ascertaining means includes a first comparator means to which said filtered output signal and said clock signal are supplied and which checks for each data signal of said filtered output signal whether the magnitude thereof is outside or inside a predetermined range and accordingly provides a quality indicating output signal the magnitude of which is indicative of the quality of said data signals, and a second comparator means for comparing the magnitude of said quality indicating output signal with a first reference signal and providing said sweep generator control signal.

Thus the operation of the sweep generator is controlled by the quality of the signal at the output of the first filter circuit and is for instance continued as long as this quality is not above a predetermined level.

The above mentioned and other objects and features of the invention will become more apparent and the invention itself will be best understood by referring to the following description of an embodiment taken in conjunction with the accompanying drawings in which:

DETAILED DESCRIPTION OF THE INVENTION

Figure 1:
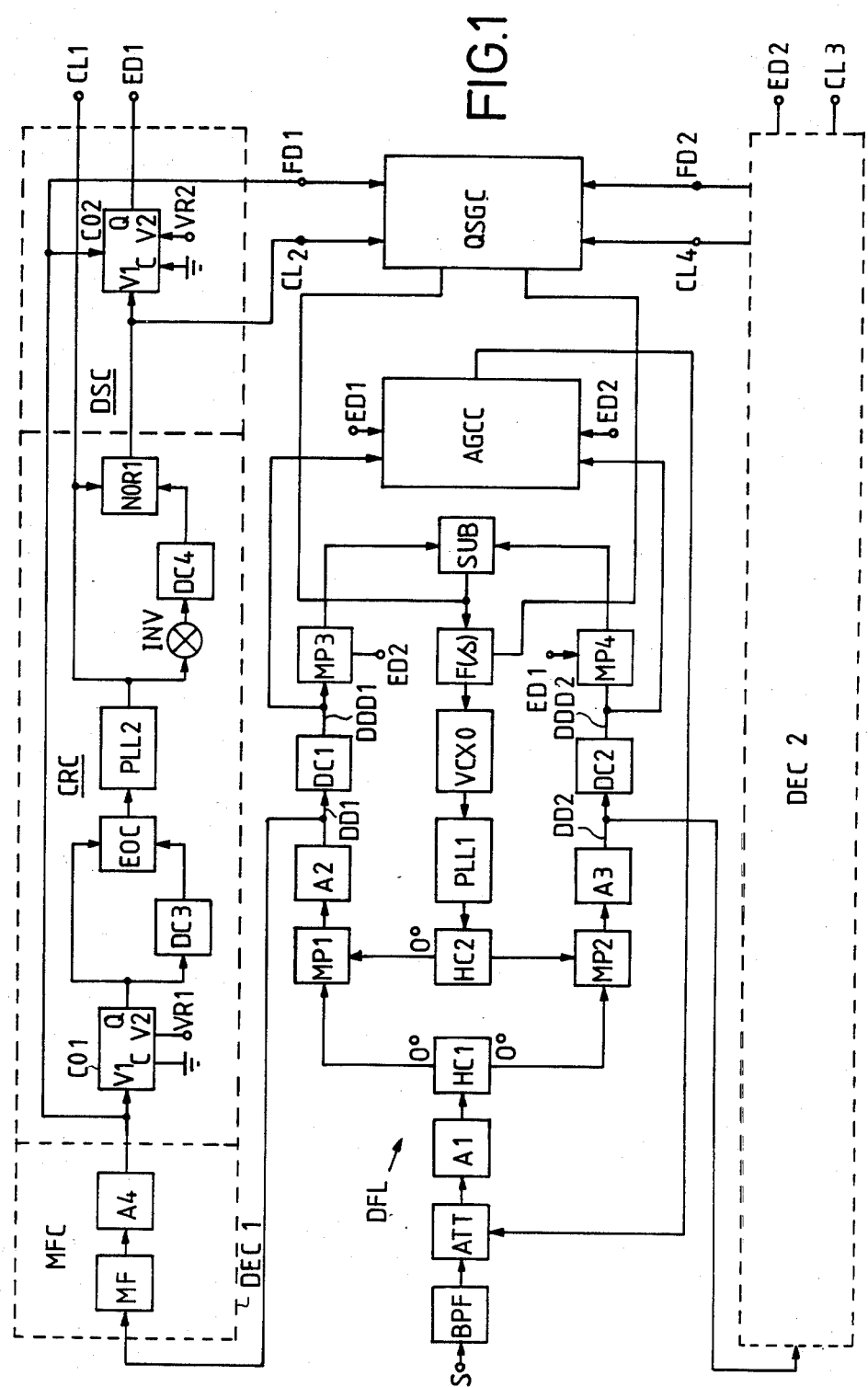
FIG. 1 is a schematic view of a demodulator circuit according to the invention.

The demodulator circuit shown in FIG. 1 is a quadriphase demodulator circuit including a decision feedback loop which comprises a double feedback loop DFL and two data estimation circuits DEC1 and DEC2 and to which an automatic gain control circuit AGCC and a quality controlled sweep generator circuit QSGC are associated. The data estimation circuits DEC1, DEC2 have two clock signals outputs CL1, CL2; CL3, CL4, a filtered data output FD1, FD2 and an estimated data output ED1, ED2.

A guadriphase decision feedback circuit which comprises a double feedback loop and two data estimation circuit is already known from the above mentioned book "Telecommunication System Engineering" and more particularly from FIGS. 2-34 on page 76 thereof. However, the data estimation circuits do not have clock signal outputs.

Input S of the demodulator circuit is connected via the series connection of a bandpass filter BPF, an attenuator ATT which is controlled by AGCC and an intermediate frequency amplifier A1 to a hybrid circuit HC1 having two in-phase outputs which are both indicated by 0° and constitute the inputs of a pair of phaselock loops having an individual branch and a common branch. The individual branch of the first phaselock loop comprises the cascade connection of an analog multiplier MP1, and amplifier A2, a delay circuit DC1, and an analog multiplier MP3, whilst the individual branch of the second phaselock loop likewise comprises the cascade connection of an analog multiplier MP2, and an amplifier A3, a delay circuit DC2 and an analog multiplier MP4. The common branch includes the cascade connection of a subtractor circuit SUB, a loop filter F(s), a voltage controlled crystal oscillator VCXO, a multiplying phaselock loop PLL1 and a hybrid circuit HC2 having an in-phase output and a quadrature output which are indicated by 0° and 90° and connected to a second input of MP1 and MP2 respectively. Second inputs of MP3 and MP4 are connected to the estimated data outputs ED2 and ED1 of DEC2 and DEC1 respectively and the outputs of MP3 and MP4 are connected to the inputs of subtractor circuit SUB.

MP1 and MP2 are for instance of the type MD614 manufactured by Anzac, whilst MP3 and MP4 are for instance of the type TAK 3 H manufactured by Mini-Circuits. ATT is for instance of the type 8437-5003 manufactured by Microwave Associated.

The outputs of A2 and A3 are also connected to the inputs of DEC1 and DEC2 respectively and the outputs of DC1 and DC2 are also connected to inputs of AGCC, further inputs of which are connected to outputs ED1 and ED2 of DEC1 and DEC2 respectively. The output of AGCC is connected to the control input of ATT.

F(s) and SUB are also connected to QSGC, other inputs of which are connected to the outputs CL2, FD1 and CL4, FD2 of DEC1 and DEC2 respectively.

DEC1 and DEC2 are identical and therefore only DEC1 is described in detail hereinafter.

DEC1 includes a matched filter circuit MFC, a clock recovering circuit CRC and a data sampling circuit DSC. The MFC includes the cascade connection of a matched filter MF and an amplifier A4. As is well known in the art, e.g. from the book "Statistical Communication Theory" by J. B. Thomas, J. Wiley and Sons, Inc, New York and more particularly from page 190 thereof, a matched filter has a transfer function $$H^x(w) = S(-w)e^{-jwt_1}$$

Therein w is the angular frequency; S(w) is the Fourier transform of the input signal i.e. DD1 in the present case and $t_1$ is the time at which the signal-to-noise power ratio of the filter output signal is a maximum.

Because the input signal DD1 applied to MF is the so-called periodic gate function, one has:

$$S(-w) = T \operatorname{sinc} \frac{wT}{2}$$

so that $$H^x(w) = T \operatorname{sinc} \frac{wT}{2} \cdot e^{-jwt_1}$$

Hence, the Fourier transform of the output signal of the matched filter is equal to $$T^2 \operatorname{sinc}^2 \frac{wT}{2} \cdot e^{-jwt_1}$$

and in the time domain this is a triangular waveform which reaches its maximum at $t = t_1$ i.e. at the end of each data bit of DD1 when $t_1$ is chosen equal to (T/2).

The CRC includes an analog/digital comparator circuit CO1 with a signal input V1 connected to the output of A4, a signal input V2 connected to reference voltage VR1=0, a grounded clock input C and a signal output Q connected to the two inputs of an Exclusive-OR circuit EOC directly and via a delay circuit DC3 respectively. The output EOC is connected to a phaselock loop PLL2 having a clock signal output CL1 connected to the two inputs of a NOR-gate NOR1 directly and via the series connection of an inverter INV and a delay circuit DC4 respectively. The clock signal output CL2 of NOR-gate NOR1 constitutes the output of the CRC and is connected to inputs of DSC and QSGC.

The DSC includes an analog/digital comparator circuit CO2 having a signal input V1 connected to the output CL2 of NOR1, another signal input V2 connected to a reference voltage VR2=0, a grounded clock input C and an output Q which constitutes the estimated data output ED1.

DC3 and EOC form a so-called multiply-and-delay circuit of the type represented on page 432, FIGS. 14-1 (a) of the book "Digital Communications by Satellite" by J. J. Spilker, Prentice Hall, Inc. On FIGS. 14-1 (c) of the same page this book also shows the combination of a matched filter and an even-law nonlinearity for which in the present case the above multiply-and-delay circuit DC3, EOC has been substituted.

The comparator circuits CO1 and CO2 are analog/digital comparator circuits of the type No. 1651 manufactured by Motorola. They have signal inputs V1 and V2, clock inputs C and signal outputs Q and $\overline{Q}$. The truth table of these comparator circuits is as follows:

| C | V1, | V2 | Qn + 1 | $\overline{Qn}$ + 1 |
|---|-----|-----|--------|---------------------|
| H | V1  | V2  | H      | 1                   |
| H | V1  | V2  | L      | H                   |

| L | X | Qn | $\overline{Qn}$ |
| --- | --- | --- | --- | wherein X means "of no importance"; L means deactivated or 0 and H means activated or 1.

The operation of the above quadriphase demodulator circuit is described hereinafter.

When a suppressed carrier QPSK modulated noisy data bitstream coded in the NRZ code and having a frequency of e.g. 720 MHz is applied to input S of the circuit, it is supplied via BPF, ATT, A1 and HC1 to MP1 and MP2. In MP1 it is multiplied with an in-phase reference carrier signal appearing at the output 0° of HC2 and in MP2 it is multiplied with a quadrature reference carrier signal appearing at the output 90° of HC2. The resultant demodulated data bitstreams are amplified in A2 and A3 respectively, these demodulated bitstreams being called DD1 and DD2 respectively. Each of the data bitstreams DD1, DD2 is delayed in DC1, DC2 over one data bit of DD1, DD2 before being cross-multiplied in MP3, MP4 with the estimated data bitstream ED2, ED1. The delayed data are called DDD1 and DDD2. To be noted that the delay circuits DC1 and DC2 are required because ED1 and ED2 are delayed in DEC1 and DEC2 with respect to DD1 and DD2 over a same time interval.

The demodulated data bitstream DD1 is also supplied to DEC1, whilst DD2 is also applied to DEC2. Because the operation of DEC1 and DEC2 is the same, only that of DEC1 is considered hereinafter.

The purpose of DEC1 is to derive from the noisy data bitstream DD1 an estimated data bitstream ED1 having a minimum bit error rate in the presence of the noise of DD1.

This object is achieved by the use of the matched filter circuit MFC which provides at its output a filtered data bitstream having an optimum signal-to-noise ratio at the end of each data bit of DD1 and by the use of data sampling circuit DSC which samples this filtered bitstream at the end of each such bit. This will now be explained in more detail.

Each time a data bit of the data bitstream DD1 supplied to MF follows a data bit of opposite sign the amplitude of the MF output signal (FIG. 4) increases or decreases substantially in a linear way between two limit values which are equal but of opposite sign and reaches the corresponding limited value at the end of data bit. The sign of the MF output signal therefore changes in the middle of each data bit following one of opposite sign. But when two successive data bits are the same the amplitude of the MF output signal also remains the same. This output signal is amplified in A4, the filtered and amplified signal being called FD1.

Figure 4:
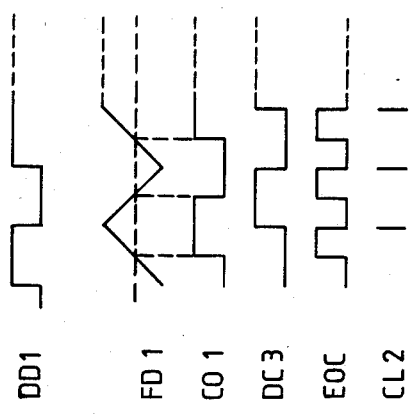
FIG. 4 shows waveforms appearing at various points of the circuit of FIG. 1.

The filtered data bitstream FD1 is supplied to comparator circuit CO1 of the clock recovery circuit CRC. Because VR1=0 and the clock input C is activated the digital output signal Q of CO1 changes from 0 to 1 or vice-versa in the middle of each data bit following a data bit of opposite sign of DD1, as shown in FIG. 4. In EOC an exclusive-OR function is realized of the digital output signal Q of CO1 and of the delayed version DC3 thereof appearing at the output of DC3 which produces a half bit delay. Therefore, the output clock signal EOC of EOC includes a positive clock pulse for each of the bits of the data bit stream DD1 supplied to MFC. However, the noise of this bit stream produces phase jitter in the output signal of EOC. To remove this jitter use is made of the phaselock loop PLL2 generating at its output CL1 a like named substantially jitter-free clock signal CL1. This clock signal CL1 is then transformed into a sampling clock signal CL2 by applying it to NOR gate NOR1 together with an inverted and slightly delayed version thereof provided by INV and DC4. Sampling clock signal CL2 (FIG. 4) has a sampling pulse at the end of each data bit of DD1, i.e. when the signal-to-noise ratio of DD1 is optimum. For this reason, these sampling pulses are used in the data sampling circuit DSC for sampling the data bitstream DD1. More particularly the sampling pulses clock comparator circuit CO2 which compares data bitstream FD1 with reference signal VR2=0 and provides at its output ED1 the like named estimated data bitstream ED1. This bitstream has a minimum bit error rate in the presence of the noise of DD1.

As already mentioned above the delayed data bitstreams DDD1 and DDD2 are multiplied in MP3 and MP4 with ED2 and ED1 respectively. The output signals of MP3 and MP1 are subtracted in SUB which provides at its output an error signal which is applied via VCXO and PLL1 to HC2. The VCXO generates a 7.2 MHz signal which is multiplied by 100 in PLL1 providing a 720 MHz carrier signal at its output.

Figure 2:
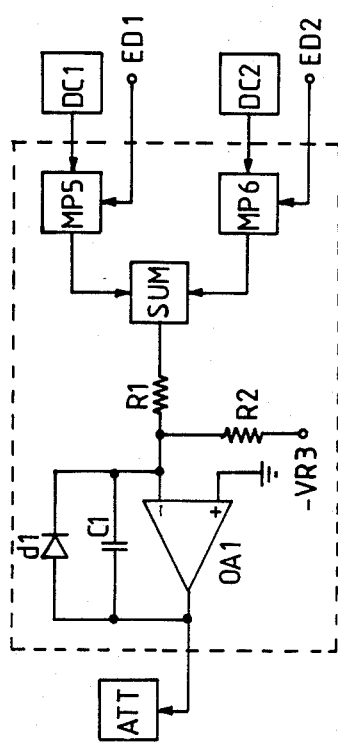
FIGS. 2 and 3 show circuits AGCC and QSGC of FIG. 1 in more detail respectively.

The AGCC shown in FIG. 2 includes multiplier circuits MP5 and MP6 which are of the same type as MP3 and MP4. MP5 and MP6 have first inputs connected to the outputs of DC1 and DC2 respectively and second inputs connected to the estimated data outputs ED1 and ED2 respectively. The outputs of MP5 and MP6 are connected to a summing circuit SUM the output of which is connected via a resistor R1 to the inverting input of operational amplifier OA1 having a grounded non-inverting input and constituting an integrator circuit. The inverting input of OA1 is also connected on the one hand to a reference voltage $-VR3$ via resistor R2 and on the other hand to its output via capacitor C1 shunted by clamping diode d1. The output of OA1 is connected to the control input of the voltage controlled attenuator ATT. It is to be noted that the summing circuit SUM is well known and makes use of an operational amplifier.

In MP5 the noisy data bitstream DD1 is multiplied, after having been delayed in DC1, with the estimated data bitstream ED1 having a minimum bit error rate in the presence of the noise of DD1. Likewise in MP6 the noisy data bitstream DD2 is multiplied after having been delayed in DC2, with the estimated data bitstream ED2 having a minimum bit error rate in the presence of the noise of DD2.

It has been found that the output signals of MP5 and MP6 are substantially not affected by the noise of DD1, DD2 and the bit errors of ED1, ED2. This is also true for the AGCC output signal which is obtained by adding the output signals of MP5 and MP6 in the summing circuit SUM and by then applying the output signal of SUM to the filter and comparator circuit including OA1. Therein the output signal of SUM is filtered to remove any unwanted frequency components and compared with level $-VR3$ to make the AGC control only effective above this level.

Figure 3:
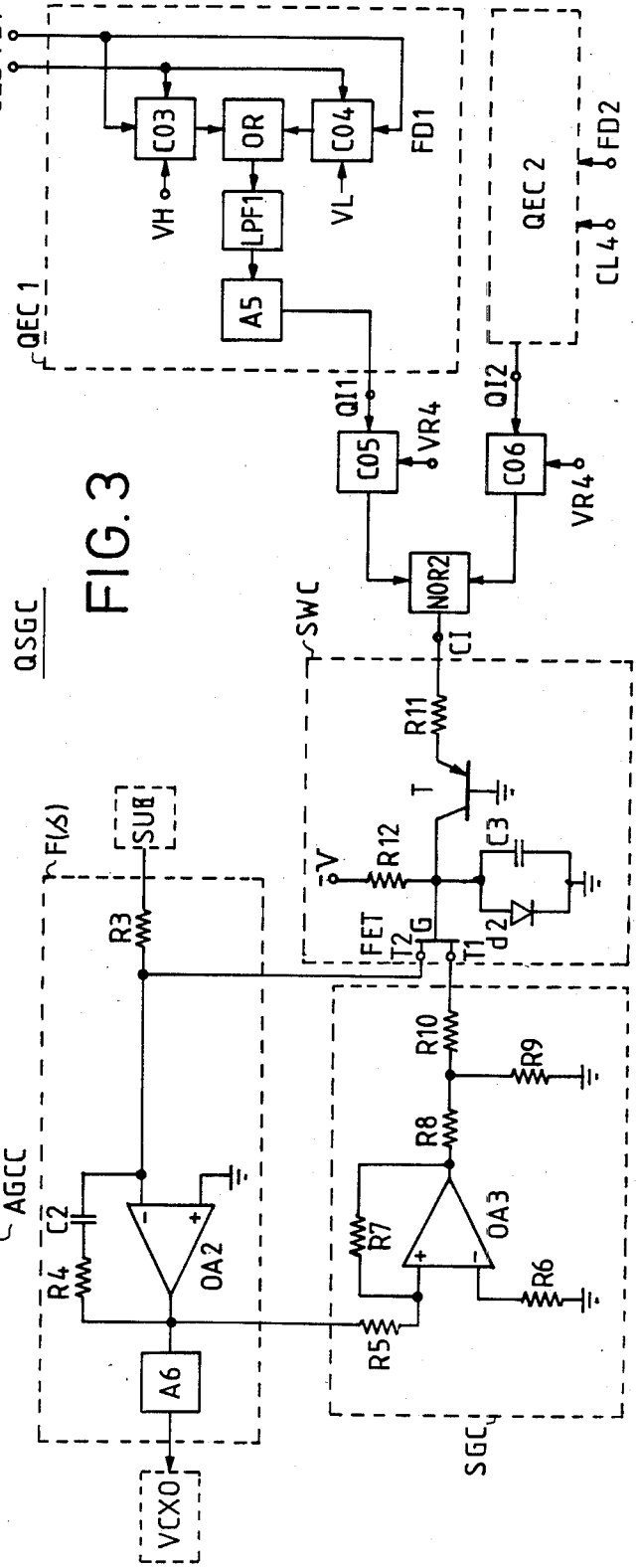

The quality controlled sweep generator circuit QSGC shown in FIG. 3 includes quality estimation circuits QEC1 and QEC2 and a sweep generator F(s), SGC, SWC.

The purpose of QSGC is to check whether the quality of each of the filtered data bitstreams FD1 and FD2 is above or below a predetermined quality level and to maintain the sweep generator in operation as long as this level is not reached by FD1 or FD2.

QEC1 includes comparator circuits CO3 and CO4 which are of the same type as CO1 and CO2. CO3 has a first input connected to the filtered data output FD1 of SDEC1, a second input connected to a reference voltage VH= +0.5 Volt, a clock input connected to the sampling clock output CL2 of DEC1 and an output connected to a first input of an OR-gate OR. CO4 has a first input connected to a reference voltage VL= −0.5 Volt, a second input connected to FD1, a clock input connected to CL2 and an output connected to a second input of OR-gate OR. The output of this gate is connected to the output terminal QI1 of QEC1 via a low-pass filter LPF1 and an amplifier A5 in series.

As already explained above, each of the sampling pulses of clock signal CL2 occurs at the end of a data bit of the data bit stream DD1 supplied to DEC1. Comparator circuits CO3 and CO4 are both controlled by these sampling clock pulses. CO3 checks at the occurrence of each such pulse whether the amplitude of FD1 is higher or smaller than VH and then produces an output signal 1 or 0 respectively. Likewise, comparator circuit CO4 checks whether the amplitude of FD1 is higher or smaller then VL and then produces an output signal 0 to 1 respectively. It is clear that the quality of a received data bit applied to CO3 and CO4 is good when the amplitude of FD1 remains above VH for a 1 or below VL for a 0 and not good when due to noise this amplitude also varies between VL and VH. In other words, the output signals of CO3 and CO4 have opposite binary values when the quality of a received data bit is good and have the same binary values when this quality is not good. In the first case the OR-gate OR provides an output bit signal 1 and in the second case this output bit signal is 0. The output signal of OR is filtered in LPF1 and then amplified in A5 which hence provides at its output QI1 a DC signal the amplitude of which is indicative of the quality of the data bit stream DD1.

QEC2 is identical to QEC1 and has inputs connected to CL4 and FD2 of DEC2 and an output QI2 at which appears a DC signal which is indicative of the quality of the data bit stream DD2.

The outputs QI1 and QI2 of QEC1 and QEC2 respectively are connected to first inputs of comparator circuits CO5 and CO6, the second inputs of which are connected to a same reference voltage VR4. The reference level VR4 corresponds to a predetermined quality level. The outputs of CO5 and CO6 are connected to the inputs of a NOR gate NOR2 having an output which is connected to a control input CI of a switching circuit SWC. This circuit SWC which will be described later further has a terminal T1 connected to the sweep generator circuit SGC which together with loop filter F(s) forms a sweep generator, and a terminal T2 connected to F(s).

This loop filter F(s) is connected between SUB and VCXO and includes an operational amplifier OA2 having a grounded non-inverting input and an inverting input which is connected to terminal T2 of SWC directly, to SUB via resistor R3 and to its own output via a filtering negative feedback circuit comprising capacitor C2 and resistor R4 in series. The latter output is also connected to the input of VCXO via amplifier A6 and via resistor R5 to the non-inverting input of operational amplifier OA3 forming part of SGC. OA3 has an inverting input which is connected to ground through resistor R6 and its non-inverting input is also connected to its output via positive feedback resistor R7. The output of OA3 is further also connected to one end of a voltage divider comprising resistors R8 and R9 the junction point of which is connected to terminal T1 of SWC via resistor R10.

Switching circuit SWC includes a PNP transistor T and a field effect transistor FET. The control input CI of SWC is connected via resistor R11 to the emitter of transistor T having a grounded base and a collector which is connected to −V= −15 Volts via collector resistor R12, to ground via filter capacitor C3 and clamping diode d2 in parallel and to gate electrode G of FET the source and drain electrodes of which constitute the terminals T1 and T2 of SWC.

The operation of the QSGC is described hereinafter.

When none of the quality indicating signals provided at the outputs QI1 and QI2 of QEC1 and QEC2 exceeds the reference level VR4, i.e. when the quality of both the filtered signals FD1 and FD2 is considered insufficient, the output signal of NOR2 is activated so that transistor T is conductive. As a consequence the gate electrode G of FET is activated so that the output of OA3 is coupled to the inverting input of OA2. The latter output is either at a voltage V= +15 Volt or −V, V being the supply voltage of OA3. Supposing that this output is at the voltage V, a fraction thereof provided by voltage divider R8, R9 is applied via resistor R10 and FET to the non-inverting input of OA2 wherein this voltage is integrated. Thus the voltage at the output of OA2 gradually decreases and the same is true for the voltage at the non-inverting input of OA3. When this decrease exceeds a certain level the voltage at the output of OA3 changes to −V and as a consequence OA2 will then produce a gradually increasing voltage at its output. In other words, the sweep voltage generated at the output of OA2, i.e. also the voltage at the output of F(s), is a sawtooth waveform. The amplitude and frequency of this waveform can be changed e.g. by means of resistors R7 and R10 respectively.

From the above it follows that F(s) in combination with SGC, SWC constitutes a sweep generator which supplies a sawtooth-shaped sweep waveform to the VCXO.

When at least one of the quality indication signals produced at the outputs QI1 and QI2 of QEC1 and QEC2 exceeds the reference level VR4, i.e. when the quality of one of the filtered signals FD1 and FD2 is considered to be sufficient. the output signal of NOR2 is de-activated so that transistor T and therefore also FET are blocked. Thus this loop between OA2 and OA3 is opened so that no sweep waveform is applied to the VCXO. This loop opening is necessary because otherwise SGC would introduce a phase error in the phase-lock loop.

Figure 5:
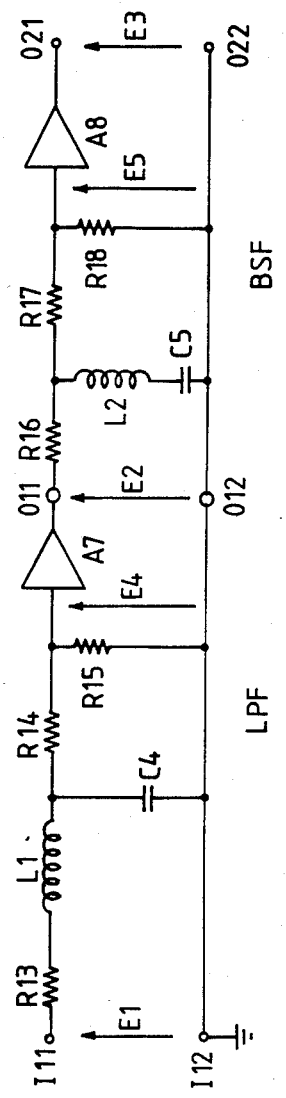
FIG. 5 represents matched filter circuit MF of FIG. 1 in more detail.

The matched filter MF shown in FIG. 5 comprises a lowpass filter LPF and a symmetrical bandstop filter BSF which are connected in cascade.

LPF has input terminals I11 and I12 and output terminals O11 and O12. I12 and O12 are interconnected and grounded and I11 is connected to O11 via resistor R13, self inductance coil L1, resistor R14 and amplifier A7 in series, the junction points of L1 and R14 and R14 and A7 being connected to ground via capacitor C4 and resistor R15 respectively.

BSF has input terminals O11 and O12 and output terminals O21 and O22. O12 and O22 are interconnected and O11 is connected to O21 via resistors R16 and R17 and amplifier A8 in series. The junction point of R16 and R17 is connected to ground via the series connection of self inductance coil L2 and capacitor C5, whilst the junction point of R17 and A8 is connected to ground through resistor R18.

The voltage transfer functions of LPF and BSF are:

$$\frac{E2}{E1} = \frac{w_n^2}{s^2 + 2aw_n s + w_n^2} \text{ and } \frac{E3}{E2} = \frac{s^2 + w_n^2}{s^2 + 2aw_n s + w_n^2}$$

where $$\frac{E2}{E4} = \frac{E3}{E5} = m + 1;$$

R13=R15=R16=R18=R;
R14=R17=(m−1)R $$w_n^2 = \frac{m+1}{m} \cdot \frac{1}{L_1 C_4} = \frac{1}{L_2 C_5};$$

$$2aw_n = \frac{R}{L_1}\left(1 + \frac{L_1}{mC_4 R^2}\right) = \frac{m}{m+1} \cdot \frac{R}{L_2};$$

m is an integer
w is the angular frequency
s is the complex frequency
$w_n = 2\pi f$ where f is the bit rate of the input signal
In a preferred embodiment;
R 50 ohm;
R14=R17=220 ohm $$a = \frac{1}{\sqrt{2}}$$

f is for instance equal to 25 megabit per second.
The overall voltage transfer function of the filter MF is equal to $$\frac{E3}{E1} = \frac{w_n^2(s^2 + w_n^2)}{(s^2 + \sqrt{2} w_n s + w_n^2)^2} \text{ when } a = \frac{1}{\sqrt{2}}$$

This transfer function fairly well approximates the above mentioned wanted sinc function for MF and has a transmission zero at $w=w_n$ and very small values at $w=2w_n$; $w=3w_n$ etc.

In the above matched filter MF lowpass filter LPF precedes bandstop filter BSF because LPF thus filters out most of the noise and prevents the latter from influencing the amplifiers A7 and A8.

It should be noted that the principles underlying the AGCC and the QSGC described above in connection with a QPSK demodulator circuit are also applicable in other types of phase demodulator circuits, such as UQPSK, i.e. unbalanced QPSK, and BPSK demodulator circuits. More particularly, in the case of a BPSK demodulator circuit the AGCC is controlled by ED1 and DDD1, whilst the QSGC is controlled by FD1 and CL2.

While the principles of the invention have been described above in connection with specific apparatus, it is to be clearly understood that this description is made only by way of example and not as a limitation on the scope of the invention.

We claim:

1. Demodulator circuit for demodulating a suppressed carrier phase modulated data input signal, including a carrier recovery circuit providing orthogonal reference carrier signals, first and second demodulation circuits for demodulating said input signal with respective ones of said orthogonal reference carrier signals to provide first and second demodulated signals respectively, at least one data estimation circuit for deriving a first data estimation signal from said first demodulated signal, said second demodulated signal being delayed to obtain a delayed second demodulated signal which in combination with said first data estimation signal controls said carrier recovery circuit, characterized in that said demodulator circuit further includes an AGC circuit (AGCC) which in response to said first data estimation signal (ED1) and to a delayed first demodulated signal (DDD1) derived from said first demodulated signal (DD1) provides an AGC output signal.

2. Demodulator circuit according to claim 1, characterized in that said data estimation circuit (DEC1) includes a matched filter circuit (MF) which is matched to said first demodulated signal (DD1) and which in response thereto provides a filtered output signal (FD1) having an optimum signal-to-noise ratio at a predetermined instant of each data signal of said first demodulated signal (DD1), and a data sampling circuit (DSC) for sampling said filtered output signal (FD1) at said predetermined instants to provide said first data estimation signal (ED1) and that said AGC circuit (AGCC) includes at least one multiplier circuit (MP5) for multiplying said delayed first demodulated signal (DDD1) and said first data estimation signal (ED1), a second filter circuit (OA1) for filtering the output signal of said first multiplier circuit (MP5) and providing said AGC output signal, and input signal magnitude regulating means (ATT) to which said input signal and said AGC output signal are supplied.

3. Demodulator circuit according to claim 2, characterized in that said matched filter (MF) provides said filtered output signal (FD1) having an optimum signal-to-noise ratio at the end of each data signal of said first demodulated signal (DD1).

4. Demodulator circuit according to claim 2, characterized in that said data estimation circuit (DEC1) further includes a clock recovery circuit (CRC) with a first comparator circuit (CO1) for deriving from said filtered output signal (FD1) a pulse waveform, a digital multiplier circuit (EOC) for digitally multiplying said pulse waveform and a delayed version (DC3) thereof, and means (PLL2, INV, DC4, NOR) for deriving from the output signal of said digital multiplier circuit (EOC) a sampling clock signal (CL2) for controlling said data sampling circuit (DSC).

5. Demodulator circuit according to claim 1, characterized in that it is adapted to demodulate a suppressed carrier quadriphase modulated data input signal and further includes a second said data estimation circuit (DEC2) for deriving a second said data estimation signal (ED2) from said second demodulated signal (DD2), said delayed first (DDD1) and second (DDD2) demodulated signals in combination with said first (ED1) and second (ED2) data estimation signals controlling said carrier recovery circuit, and that said AGC circuit (AGCC) provides said AGC output signal in response to said first (ED1) and second (ED2) data estimation signals and said delayed first (DDD1) and second (DDD2) demodulated signals.

6. Demodulator circuit according to claim 5, characterized in that said AGC circuit (AGCC) further includes a second said multiplier circuit (MP6) for multiplying said delayed second demodulated signal (DDD2) and said second data estimation signal (ED2) and a summing circuit (SUM) for summing output signals from said first (MP5) and second (MP6) multiplier circuits before applying them to said second filter circuit (OA1).

7. Demodulator circuit according to claim 6, characterized in that said second filter circuit includes a first operational amplifier (OA1) with an inverting input connected to the output of said summing circuit (SUM) via a first resistance (R1), to a reference voltage (−VR3) via a second resistance (R3) and to its own output via a filter capacitor (C1) and that said regulating means (ATT) comprises a voltage controlled attenuator (ATT) having a control input connected to the output of said first operational amplifier (OA1).

8. Demodulator circuit according to claim 5, characterized in that said carrier recovery circuit (MP3, MP4, SUB, F(s), VCXO) includes third (MP3) and fourth (MP4) multiplier circuits for multiplying said delayed first (DDD1) and second (DDD2) demodulated signals with said second (ED2) and first (ED1) data estimation signals respectively, subtracting means (SUB) for subtracting output signals from said third (MP3) and fourth (MP4) multiplier circuits, the output of said subtracting means (SUB) being connected to the input of a controlled oscillator (VCXO) via a loop fourth filter circuit (F(s)) filter having an output which is coupled to a circuit (HC2) providing said orthogonal reference carrier signals.

9. Demodulator circuit for demodulating a suppressed carrier phase modulated area input signal, with at least one phaselock loop circuit which includes a demodulation circuit for demodulating said input signal with a reference carrier signal provided by a controlled oscillator, a sweep generator circuit controlling said controlled oscillator, and a first filter circuit filtering a demodulated output signal supplied by said demodulation circuit and providing a filtered output signal, characterized in that it further includes ascertaining means (QEC1, CO5, CO6, NOR2) for ascertaining whether said filtered output signal (FD1) exceeds a reference voltage (VR4) which indicates a predetermined quality level and producing a sweep generator control signal which is indicative of a predetermined quality and which controls said sweep generator circuit (F(s), SGC).

10. Demodulator circuit according to claim 9, characterized in that it further includes a clocking circuit (CRC) for deriving a clock signal (CL2) from said filtered output signal (FD1) of said first filter circuit (MF) and that said ascertaining means (QEC1, CO5, CO6, NOR2) includes a first comparator means (QEC1) to which said filtered output signal (FD1) and said clock signal (CL2) are supplied and which checks for each data signal of said filtered output signal (FD1) whether the magnitude thereof is outside or inside a predetermined range (VH, VL) and accordingly provides a quality indicating output signal (QI1) the magnitude of which is indicative of the quality of said data signals, and a second comparator means (CO5, CO6, NOR2) for comparing the magnitude of said quality indicating output signal (QI1) with a first reference signal (VR4) and for providing said sweep generator control signal.

11. Demodulator circuit according to claim 10, characterized in that said first comparator means (QEC1) includes a first (CO3) and a second (CO4) comparator circuit which are both clocked by said clock signal (CL2) and wherein said filtered output signal (FD1) is compared with a second (VH) and a third (VL) reference signal respectively, gating means (OR) for combining the output signals of said first (CO3) and second (CO4) comparator circuits and a second filter circuit (LPF1) for filtering the output signal of said gating means (OR).

12. Demodulator circuit according to claim 9, characterized in that said sweep generator circuit (F(s), SGC) includes a sweep generator proper (SGC) and a loop third filter circuit (F(s)) also forming part of said phaselock loop and said loop third filter circuit (F(s)) including a first operational amplifier (OA2) with a filtering negative feedback circuit (R4, C2), with an output coupled to said controlled oscillator (VCXO) and to the non-inverting input of a second operational amplifier (OA3) and with an inverting input coupled via switching means (FET) to the output of said second operational amplifier (OA3) constituting said sweep generator proper and having a positive feedback resistance (R7), said switching means (FET) being controlled by said predetermined quality indicating control signal in order to open said switching means (FET) only when the quality is at least equal to said predetermined quality.

13. Demodulator circuit according to claim 12, characterized in that it is adapted to demodulate a suppressed carrier quadriphase modulated data input signal and includes first and second phaselock loops with first (MP1) and second (MP2) demodulation circuits demodulating said input signal with respective ones of two orthogonal reference carrier signals supplied by said controlled oscillator (VCXO) through a hybrid circuit (HC2) and providing first (DD1) and second (DD2) demodulated signals respectively, first (DEC1) and second (DEC2) data estimation circuits each including a said first filter circuit (MF) and able to derive first (ED1) and second (ED2) data estimation signals from said first (DD1) and second (DD2) demodulated signals which are further delayed to provide delayed first (DDD1) and second (DDD2) demodulated signals, and that first (MP3) and second (MP4) multiplier circuits are provided for multiplying said delayed first (DDD1) and second (DDD2) demodulated signals with said second (ED2) and first (ED1) data estimation signals respectively, subtracting means (SUB) for subtracting the output signals of said first (MP3) and second (MP4) multiplier circuits, the output of said subtracting means (SUB) being connected to the input of said controlled oscillator (VCXO) via said loop third filter circuit (F(s)).

14. Demodulator circuit according to claim 1, characterized in that said data input signal is a binary signal.

* * * * *